Dec. 20, 1960 D. C. JAMESON 2,965,850

UNITY GAIN AMPLIFIER

Filed June 1, 1956 2 Sheets-Sheet 1

INVENTOR.
DONALD C. JAMESON,
BY
[signature]
ATTORNEY.

Dec. 20, 1960 D. C. JAMESON 2,965,850

UNITY GAIN AMPLIFIER

Filed June 1, 1956 2 Sheets-Sheet 2

INVENTOR.
DONALD C. JAMESON,
BY
ATTORNEY.

2,965,850

UNITY GAIN AMPLIFIER

Donald C. Jameson, Los Angeles, Calif., assignor to Hughes Aircraft Company, Culver City, Calif., a corporation of Delaware Filed June 1, 1956, Ser. No. 588,914

3 Claims. (Cl. 330—9)

The present invention relates generally to signal translating circuits and particularly to unity gain amplifier circuits which provide a precision unity gain over a wide frequency band width down to and including direct current (D.C.).

Two basic methods are normally utilized for producing unity gain amplification. The first method is termed an indirect method and utilizes an even number of negative gain amplifiers connected in series, the product of their gain being unity. The direct method uses a differential amplifier which directly senses the voltage difference between input signals and output signals and thus provides information which can be utilized to correct for the existing error. The accuracy of the unity gain amplifiers of the first type is a function of the amount of loop gain in each loop plus the degree of precision in the feed back resistors which are utilized in the circuit. The accuracy of the second type is also dependent on the amount of loop gain but will depend mainly on the accuracy of the differential amplifier used to sense the error signals. In the past the unity gain amplifiers of the second type were more inaccurate than the first type, especially when vacuum tubes were used for the differential amplification. The present invention, however, reverses this situation and permits the use of vacuum tube amplifiers to provide a unity gain amplifier circuit which far exceeds the accuracy practical with amplifiers of the first type.

It is, therefore, an object of this invention to provide an improved precision unity gain amplifier circuit.

It is a further object of this invention to provide a unity gain amplifier circuit which does not require the use of precision resistors to obtain a high degree of over-all accuracy.

It is still a further object of this invention to provide a unity gain amplifier circuit capable of providing signal translation over a wide voltage range and of receiving these signals from a signal source having a variable impedance which is extremely high.

In accordance with the present invention an alternating current (A.C.) differential amplifier is coupled to a signal input terminal and to a signal output terminal of a unity gain amplifier circuit in such a manner as to be sensitive to any A.C. signal differences existing between the input signals and the output signals. Any signal difference, which is termed an error signal, is amplified by the A.C. differential amplifier and applied to the signal input circuit of a power amplifier for further amplification. The further amplified error signal is developed across the signal output circuit and is effective to alter the magnitude of the output signal by an amount and in a direction to reduce the A.C. error signal to substantially zero.

In a similar manner a chopper stabilized amplifier is coupled to a signal input terminal and to a signal output terminal of a unity gain amplifier circuit in a manner such that it is sensitive to any direct current (D.C.) difference between the input signals and the output signals. Any D.C. signal difference is amplified by the chopper stabilized amplifier and applied to the signal input circuit of the power amplifier, which further amplifies the error signal in a manner which provides a corrective signal in the output circuit of the unity gain amplifier of a magnitude and in a direction which reduces the D.C. error signal to substantially zero.

A floating voltage supply which floats with respect to signal ground by having its negative terminal coupled to a non-grounded signal output terminal supplies power for the A.C. differential amplifier and the chopper stabilized amplifier. The use of a floating voltage supply enables the use of a circuit arrangement which provides this unity gain amplifier circuit with the characteristics of high input impedance at all frequencies, and eliminates the need of the usual precision resistors associated with resistive feedback networks.

Moreover, the circuit arrangement provided in accordance with the present invention is such that the A.C. differential amplifier and the chopper stabilized amplifier are subjected to only the error signals, which have a relatively small value, and thus this unity gain amplifier can transfer signals which vary over a wide voltage range. Since the various amplifiers within the unity gain amplifier are handling small signals, high gain tubes with small dynamic ranges can be utilized, which adds to the over-all accuracy of the system.

The invention will be better understood from the following description considered in connection with the accompanying drawings in which.

Figure 1:
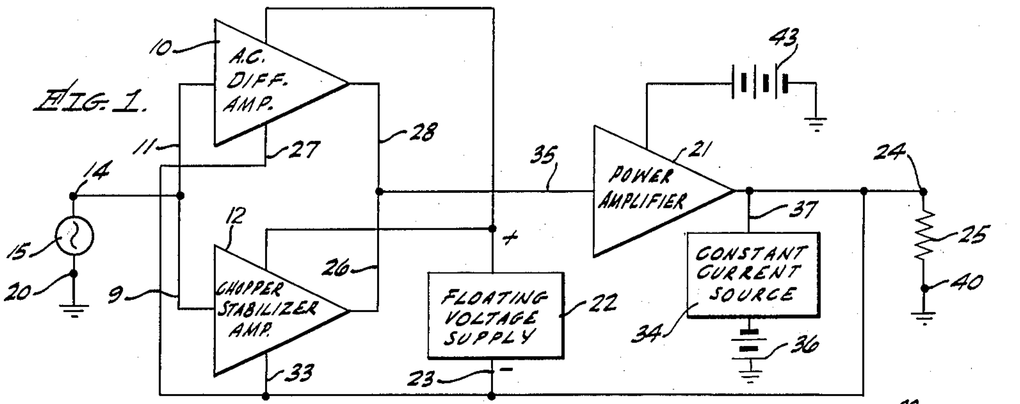
Fig. 1 is a block diagram of one embodiment of the unity gain amplifier circuit provided in accordance with the present invention.

In Fig. 1, a signal source 15 is connected across a pair of signal input terminals 14 and 20 with the signal input terminal 20 being connected to a point of fixed reference potential, or signal ground. A load impedance element illustrated as a resistor 25 is connected across the signal output terminals 24 and 40, with the signal output terminal 40 being connected to signal ground. An A.C. differential amplifier 10 is coupled to the signal input terminal 14 through a lead 11 and is also coupled to the signal output terminal 24 through a lead 27. The pair of leads 11 and 27 comprise the signal input leads for the A.C. differential amplifier 10 and thus, any A.C. signal difference appearing between the signal input terminal 14 and the signal output terminal 24 is amplified by the A.C. differential amplifier 10.

A chopper stabilized amplifier 12 is coupled to the signal input terminal 14 through a lead 9 and is also coupled to the signal output terminal 24 through a lead 33. The leads 33 and 9 serve as the signal input leads for the chopper stabilizer amplifier 12 and therefore any D.C. signal difference between the signal input terminal 14 and the signal output terminal 24 is amplified by the chopper stabilized amplifier 12.

The signal output lead 28 of the A.C. differential amplifier 10 and the signal output lead 26 of the chopper stabilized amplifier 12 are coupled with the signal input lead 35 of a power amplifier 21 which serves to further amplify the signal difference between the signal output terminal 24 and the A.C. and D.C. error signals received from the A.C. differential amplifier 10 and the chopper stabilized amplifier 12. The signal output circuit of the power amplifier 21 includes the load impedance 25 across which is developed a corrective voltage of a magnitude and in a direction to reduce the error signal to substantially zero. Thus, since the signal input terminal 20 and the signal output terminal 40 are each connected directly to signal ground, and the above described action continuously maintains the signal output terminal 24 at substantially the same signal potential as the signal input terminal 14, the signal across the load impedance 25 is always substantially equal to the signal output of the signal source 15.

The power amplifier 21 is supplied with power by a direct current energizing potential illustrated as a battery 43 having its negative terminal connected to signal ground, and is further coupled with a constant current source 34 which supplies current for the load impedance 25 and the power amplifier 21. The constant current source 34 is supplied with power by a source of direct current energizing potential illustrated as a battery 41 having its positive terminal connected to signal ground.

A floating voltage supply 22 supplies power to the A.C. differential amplifier 10 and the chopper stabilized amplifier 12. This voltage supply 22 is termed a floating voltage supply because it is connected directly to the signal output terminal 24 by the lead 23 and is not referred directly to signal ground. This circuit arrangement substantially isolates the A.C. differential amplifier 10 and the chopper stabilized amplifier 12 from ground, and thus the A.C. differential amplifier 10 amplifies only the signal difference between the signal input terminal 14 and the signal output terminal 24. In addition, the chopper stabilized amplifier 12 is subjected only to small signals and therefore has no tendency to become non-conducting as a result of large signals impressed upon the unity gain amplifier circuit.

The constant current source 34 maintains the power amplifier 21 in a conductive condition at all times, and is needed only if the power amplifier 21 is subjected to signals which are of sufficient magnitude and of proper polarity which would tend to bias the power amplifier 21 to a nonconductive state.

Figure 2:
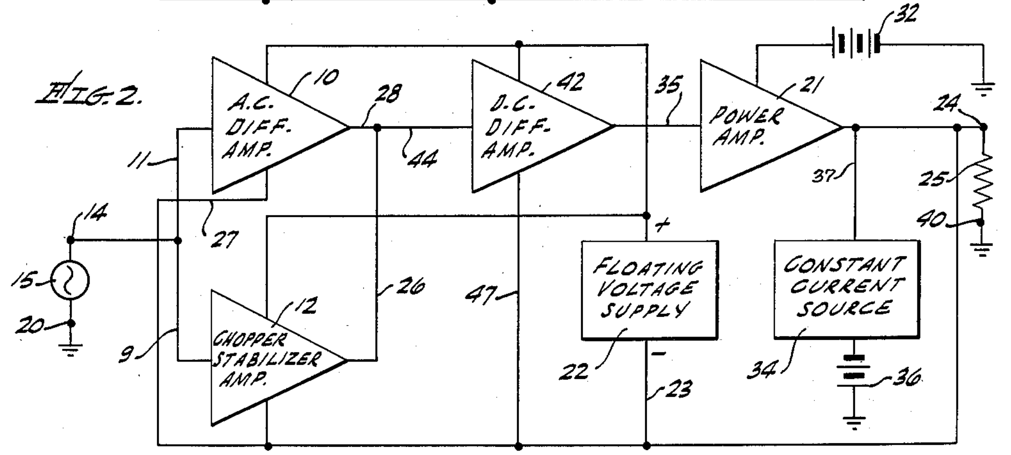
Fig. 2 is a block diagram of a further embodiment of the unity gain amplifier circuit provided in accordance with the present invention.

A further embodiment of the unity gain amplifier circuit provided in accordance with the present invention is illustrated in Fig. 2 and, in addition to the components of the unity gain amplifier circuit shown in Fig. 1, includes a D.C. differential amplifier 42 having a signal input lead 44 coupled to the signal output leads 26 and 28 of the chopper stabilized amplifier 12 and the A.C. differential amplifier 10. The D.C. differential amplifier 42 is coupled to the signal output terminal 24 by a lead 47. The signal input circuit of the D.C. differential amplifier 42 is thus composed of the leads 44 and 47, and it therefore amplifies the difference between the signal output terminal 24 and the error signals received from the chopper stabilized amplifier 12 and the A.C. differential amplifier 10. In the present embodiment, the D.C. differential amplifier 42 is also supplied with power by the floating voltage supply 22 and is thus substantially isolated from ground. The signal output circuit of the D.C. differential amplifier 42 is coupled to the signal input lead 35 of the power amplifier 21. This embodiment of the present invention operates in a manner analogous to the embodiment shown in Fig. 1, but has the advantage of being more sensitive since the D.C. differential amplifier 42 increases the amplitude of the error signal applied to the power amplifier 21.

Figure 3:
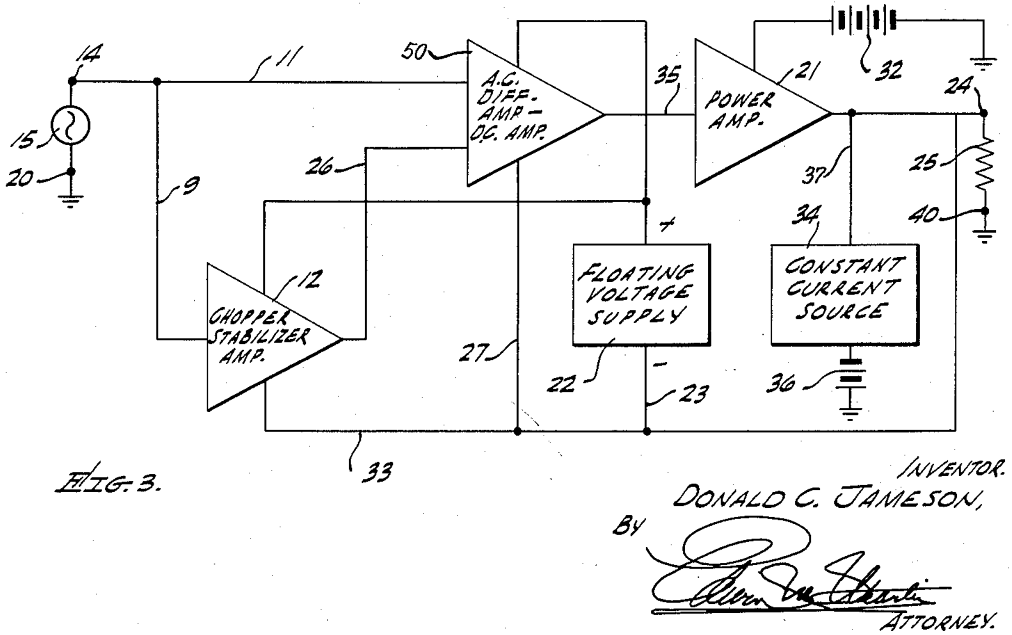
Fig. 3 is a block diagram illustrating a still further embodiment of the present invention.

A further embodiment of the present invention is shown in Fig. 3 in which an integral A.C. differential amplifier-D.C. amplifier 50 provides the functions of both A.C. differential amplification of the A.C. error signals existing between the signal input terminal 14 and signal output terminal 24, and D.C. amplification of the signal output of the chopper stabilized amplifier 12. The integral A.C. differential amplifier-D.C. amplifier 50 is coupled to the signal output terminal 24 by the lead 27 and is also coupled to the signal input terminal 14 by the lead 11. The two leads 11 and 27 serve as the A.C. signal input leads. The signal output lead 26 of the chopper stabilized amplifier 12 and the lead 27 which is connected to the signal output terminal 24 serve as the D.C. signal input leads. This integral A.C. differential amplifier-D.C. amplifier 50 also receives power from the floating voltage supply 22, and the over-all system operates in a manner analogous to the embodiment illustrated in Fig. 1.

Figure 4:
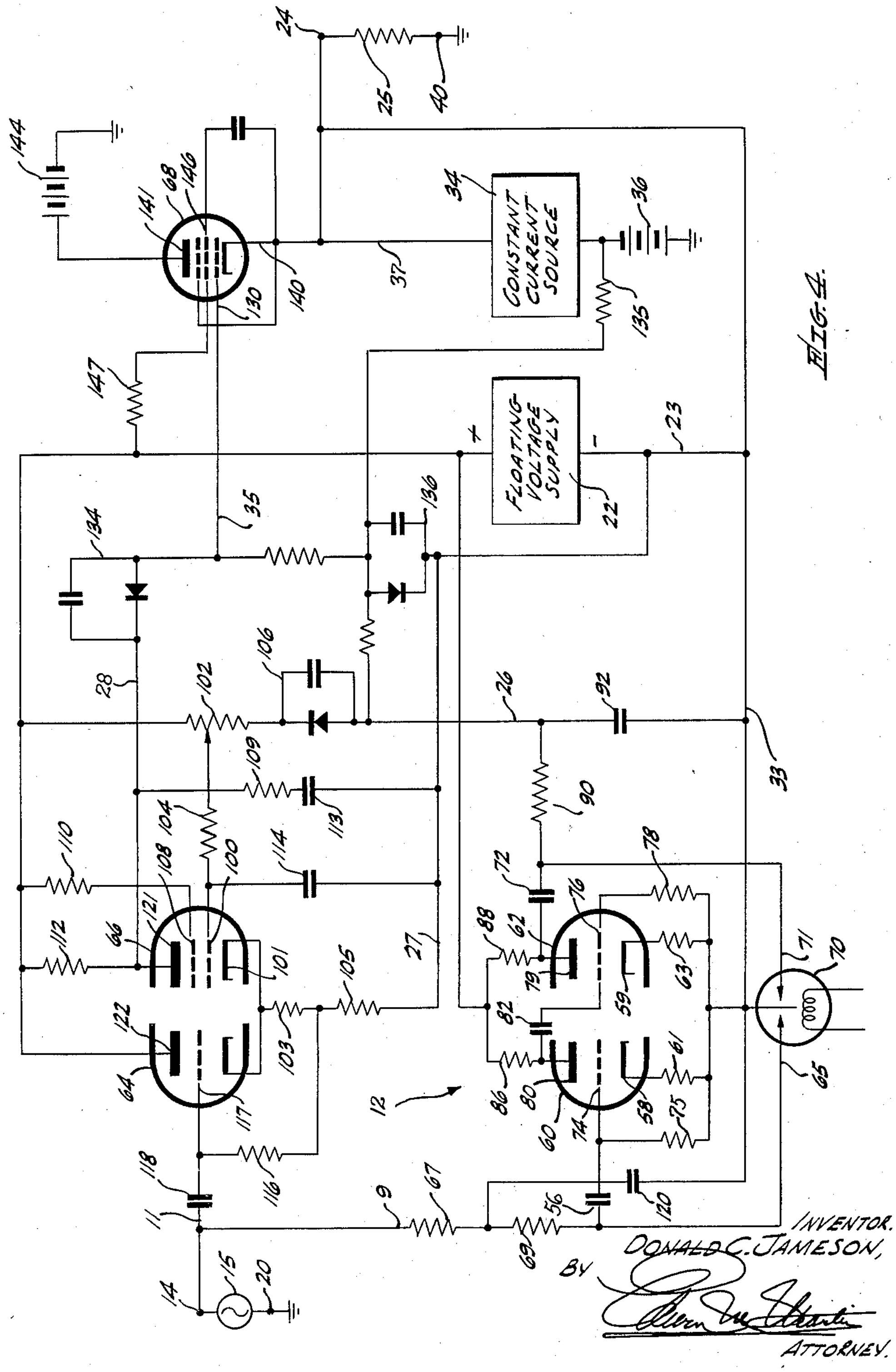
Fig. 4 is a schematic circuit diagram illustrating a specific circuit arrangement for the system shown by block diagram in Fig. 3.

In Fig. 4 the chopper stabilized amplifier 12 is shown as including two signal amplifier stages provided by a pair of electron tubes illustrated as the triodes 60 and 62. The dual A.C. differential amplifier-D.C. amplifier 50 also includes a pair of electron tubes illustrated as the triode 64 which serves as the A.C. differential amplifier and the tetrode 66 which serves as the D.C. amplifier for the signal output of the chopper stabilized amplifier 12. The power amplifier 21 includes an electron tube illustrated as the pentode 68.

More particularly, cathodes 58 and 59 of the triodes 60 and 62 in the chopper stabilized amplifier are coupled to the signal output terminal 24 through the lead 33 by way of the cathode resistors 61 and 63. The fixed contact 65 of a vibrator 70 is coupled through a capacitor 56 to the control grid 74 of triode 60 and, in addition, is coupled to the signal input terminal 14 through the filter network which includes the filter resistors 67 and 69 and the filter capacitor 120 which is coupled to the signal output terminal 24. The remaining fixed contact 71 of the vibrator 70 is coupled to the anode of the triode 62 through a coupling capacitor 72. Grid leak resistors 75 and 78 reference the control grids 74 and 76 of the triodes 60 and 62, respectively, to the vibrating contact of the vibrator 70 which in turn is connected to the output terminal 24. The anode 80 of the triode 60 is coupled to the control grid 76 of the triode 62 through the coupling capacitor 82. The anodes 80 and 79 of the triodes 60 and 62 are connected, respectively, to the positive terminal of the floating voltage supply 22 through plate resistors 86 and 88.

In operation, the capacitor 120 is charged towards a potential level that is equal to the difference between the direct-current components of the signal levels of the input signal at terminal 14 and the output signal at terminal 24. The vibrator 70 periodically connects one side of the capacitor 120 to the fixed contact 65 thereof thereby enabling the capacitor 120 to discharge through resistor 69 to produce an error signal thereacross which is coupled through the capacitor 56 to the control grid 74 of triode 60. Alternatively with the above connections, the vibrator 70 connects the output capacitor 72 to the output terminal 24 thereby clamping the output of triode 62 to a potential level equal to that of the output signal. Thus, during the alternate periods when the error signal is generated at the output of triode 72, the excursions, if any, are always relative to the potential level of the output signal appearing at terminal 24. It should be noted that the alternating components of the output signal developed across the resistor 25 are applied to the cathode 58 either directly or indirectly through capacitor 56 to the control grid 74 and through the floating voltage supply 22 to the plate 80 of tube 60 and hence have a very limited effect on the flow of current therethrough. To the extent that alternating components do appear at the outputs of tubes 60, 62, they are smoothed by the resistor 90 and capacitor 92. The periodic error signal, having been amplified by the two triodes 60 and 62, is smoothed by the filter network comprised of the resistor 90 and capacitor 92 to remove the periodic variations in D.C. levels and then impressed upon the output lead 26. Any variations which remain are further removed by the filter network disposed at the input of the tube 66 which is composed of the filter capacitor 114 and the resistor 104.

The output signal from the chopper stabilized amplifier 12 including a D.C. component supplied by a zener diode-capacitor network 106 which is inserted in the output lead 26 is applied to the control grid 100 of the tetrode 66 through a variable resistor 102 to provide a means for zero signal adjustment. The cathode 101 of the tetrode 66 is coupled by the lead 27 through the cathode resistors 103 and 105 to the signal output terminal 24. The screen grid 108 is maintained at a substantially constant D.C. potential relative to the signal output terminal 24 by means of a connection through a resistor 110 to the positive terminal of the floating voltage supply 22. The anode 121 of the tetrode 66 is coupled to the positive terminal of the floating voltage supply 22 through a load resistor 112. Consequently, the tetrode 66 provides further amplification for the signal appearing on output lead 26 with respect to the potential of lead 27 which is connected to the signal output terminal 24. The control grid 100 is maintained at the same A.C. potential as the signal output terminal 24 by the coupling capacitor 114.

An A.C. signal path between the signal input terminal 14 and the control grid 117 is provided by a coupling capacitor 118. The cathode of the triode 64 is coupled to the cathode of the tetrode 66, and is therefore coupled with the signal output terminal 24 through the common cathode coupling resistors 103 and 105. In addition, the plate 122 is coupled with the signal output terminal 24 through the floating voltage supply 22. Any A.C. signal appearing between the control grid 117 and the cathode of the triode 64 has the effect of a signal applied between the control grid 100 and the cathode of the tetrode by virtue of the cathode coupling. Thus, any A.C. signal difference between the signal input terminal 14 and the signal output terminal 24 will be amplified by the interaction of the triode 64 and the tetrode 66, with the resultant amplified error signal appearing across the load resistor 112 of the tetrode 66.

The combined error signal which is derived from the anode circuit of the tetrode 66 is applied to the control elements of the pentode 68 by way of the zener diode-capacitor network 134 which serves to provide a predetermined D.C. component for the signal. A compensation network including a serially connected resistor 109 and a capacitor 113 connected from lead 28 to lead 27 prevents oscillations by providing a low impedance path for extremely high frequency signals. Both of the zener diode-capacitor networks 106 and 134 are energized from a third zener diode-capacitor network 136 which is coupled to the battery 36 through the constant current resistor 135. These zener diode-capacitor networks serve only to provide a predetermined D.C. component for signals, and could therefore be represented as battery means.

The cathode 140 of the pentode 68 is coupled directly to the signal output terminal 24, and also to the constant current source 34. The anode 141 of the pentode 68 is connected to a D.C. source of potential, represented by the battery 144, which has its negative terminal connected to ground. The suppressor grid 146 is maintained at a substantially constant D.C. potential with respect to the signal output terminal 24 by the floating voltage supply 22 through the dropping resistor 147.

As the signal applied to the pentode 68 changes, the amount of current which the pentode 68 requires varies, and thus, the current flow through the cathode circuit must vary. The constant current source 34 supplies substantially the same amount of current at all times, and therefore variations in the current through the pentode 68 will result in variations in the current flow through the load impedance 25. This variation of current through the load impedance 25 is in such a direction that the potential of the signal output terminal 24 is changed in a direction to make it substantially equal to the potential of the signal input terminal 14. For example, if the potential of the signal output terminal 24 is more negative than the signal input terminal 14, the triode 64 of the A.C. differential amplifier is in effect subjected to a positive grid-to-cathode signal. This positive signal is amplified and the amplified signal appears as a positive signal upon the control grid 130 of the pentode 68. Since this positive signal will increase the conduction of the pentode 68, the potential of the signal output terminal 24 will become less negative with respect to the potential of the signal input terminal 14 as a result of either an increase or a decrease in electron flow through the load impedance 25. The direction of this change in electron flow through the load impedance 25 will be determined by the amount of current supplied by the constant current source 34, but will always be in the proper direction to make the potential of the signal output terminal 24 substantially equal to the potential of the signal input terminal 14.

The unity gain amplifier circuit provided in accordance with the present invention thus automatically and continuously reduces the amount of error existing between input signals and output signals to substantially zero. The circuit provided in accordance with the present invention does not require the use of precision resistors and is capable of receiving signals from a signal source having an extremely high and not necessarily constant impedance.

What is claimed is:

1. In a unity gain amplifier circuit having a pair of signal input terminals adapted to receive signals from a signal source and a pair of signal output terminals adapted to provide signals for a signal utilization device, a chopper stabilized amplifier coupled with said signal input terminals and said signal output terminals and having a signal output proportional to the direct potential difference between the signals received from said signal source and the signals provided for said signal utilization device, an alternating current differential amplifier coupled with said signal input terminals and said signal output terminals and having an output signal proportional to the alternating potential difference between the signals received from said signal source and the signals provided for said signal utilization device, a power amplifier coupled with said chopper stabilized amplifier and said alternating current differential amplifier and adapted to amplify said output signals of each of said amplifiers, said power amplifier having a signal output circuit including said signal output terminals and adapted to cause the signals provided for said signal utilization device to be substantially equal to the signals received from said signal source, and a voltage supply referenced to the instantaneous potential of the signals provided for said signal utilization device and coupled with said chopper stabilized amplifier and said alternating current differential amplifier for providing energizing potential thereto.

2. A unity gain amplifier circuit for providing signal translation between a signal source and a utilization device comprising in combination: first and second signal input terminals adapted to receive a signal having both direct-current and alternating-current components, said second signal input terminal being connected to ground; first and second signal output terminals coupled to said utilization device, said second signal output terminal being connected to ground; an alternating-current difference amplifier having inputs connected between said first signal input terminal and said first signal output terminal and an output coupled to said first signal output terminal for maintaining the alternating-components of the received signal appearing at said signal input terminal and said first signal output terminal at the same amplitude; a chopper stabilized amplifier having an input circuit responsive to the difference in direct-current potential levels existing at said first signal input and output terminals for generating an error signal constituting periodic voltage excursions of an amplitude indicative of the difference in potential levels appearing on said first signal input and output terminals; means for clamping the output of said chopper stabilized amplifier to said first signal output terminal; means responsive to the output signal of said chopper stabilized amplifier for smoothing the output signal thereof; a floating voltage supply having a negative output terminal connected to said first signal output terminal for providing a potential that is referenced to the potential level appearing at said first signal output terminal for said chopper stabilized amplifier; and means having an output circuit coupled to said first signal output terminal and responsive to said smoothed output signal for minimizing said difference in direct-current potential levels appearing on said first input and output terminals.

3. A unity gain amplifier for providing translation for a signal having both alternating-current and direct-current components, said amplifier comprising first and second signal input terminals, said first input terminal being responsive to said signal and second input terminal being connected directly to signal ground; first and second signal output terminals, said second signal output terminal being connected directly to signal ground; a first amplifier including first and second stages, said first and second stages being referenced to the potential level of said first output signal terminal; first and second resistors and a first capacitor connected in series in the order named from said first input signal terminal to the input of said first stage of said first amplifier; a second capacitor connected from said first signal output terminal to the junction between said first and second resistors; a vibrator having a movable contact connected to said first output signal terminal, a first fixed contact connected to the junction between said second resistor and said first capacitor and a second fixed contact connected to the output of said second stage of said first amplifier whereby periodic contact of said movable contact with said first fixed contact discharges said second capacitor through said second resistor to generate an error signal at the input of first stage; means coupled to the output of said second stage of said first amplifier for smoothing the amplified error signal appearing thereat; a second amplifier coupled to said first signal input terminal and responsive to the alternating components of said input signal and said smoothed amplified error signal for producing a composite output signal composed of the sum of the input signals thereto; a power supply having an output terminal connected to said first signal output terminal for providing a potential source for said first and second amplifiers; and a power amplifier having an input coupled to the output of said second amplifier and an output coupled to said first signal output terminal for maintaining the direct-current potential level thereof at the same direct-current level as that of said first signal input terminal.

References Cited in the file of this patent

UNITED STATES PATENTS

| | | |
|---|---|---|
| 2,619,552 | Kerns | Nov. 25, 1952 |
| 2,684,999 | Goldberg | July 27, 1954 |
| 2,685,000 | Vance | July 27, 1954 |
| 2,709,205 | Colls | May 24, 1955 |
| 2,714,136 | Greenwood | July 26, 1955 |
| 2,741,668 | Iffland | Apr. 10, 1956 |
| 2,796,468 | McDonald | June 18, 1957 |
| 2,874,235 | Hartwig | Feb. 17, 1959 |

OTHER REFERENCES

Goldberg: "Stabilization of Wideband Direct-Current Amplifiers for Zero and Gain," pages 296–300 RCA Review, June 1950.